United States Patent
Sultan et al.

(10) Patent No.: US 7,793,240 B2
(45) Date of Patent: Sep. 7, 2010

(54) COMPENSATING FOR LAYOUT DIMENSION EFFECTS IN SEMICONDUCTOR DEVICE MODELING

(75) Inventors: Akif Sultan, Austin, TX (US); Jian Chen, Austin, TX (US); Mark W. Michael, Cedar Park, TX (US); Jingrong R. Zhou, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 484 days.

(21) Appl. No.: 11/537,390

(22) Filed: Sep. 29, 2006

(65) Prior Publication Data

US 2008/0104550 A1 May 1, 2008

(51) Int. Cl.
*G06F 17/50* (2006.01)
(52) U.S. Cl. .................. 716/4; 716/5; 716/11
(58) Field of Classification Search .......... 716/1, 716/4–6, 8–11, 19–21
See application file for complete search history.

(56) References Cited

U.S. PATENT DOCUMENTS

| | | | |
|---|---|---|---|
| 5,986,283 A | 11/1999 | Bush et al. ............. 257/48 |
| 2002/0164085 A1* | 11/2002 | Norimatsu ............... 382/275 |
| 2004/0107410 A1* | 6/2004 | Misaka et al. ............. 716/8 |
| 2006/0238480 A1* | 10/2006 | Furihata et al. ............ 345/98 |
| 2007/0074146 A1* | 3/2007 | Tanaka et al. ............ 716/21 |
| 2007/0220476 A1* | 9/2007 | Mukherjee et al. ........ 716/18 |

OTHER PUBLICATIONS

Office Action dated Feb. 14, 2008 from related U.S. Appl. No. 11/425,913.
Final Office Action dated Sep. 22, 2008 from related U.S. Appl. No. 11/425,913.

* cited by examiner

*Primary Examiner*—Paul Dinh
(74) *Attorney, Agent, or Firm*—Williams, Morgan & Amerson, P.C.

(57) ABSTRACT

A method includes receiving design data associated with an integrated circuit device. The integrated circuit device includes a first element having a corner defined therein and a second element overlapping the first element. A dimension specified for the first element in the design data is adjusted based on a distance between the second element and the corner. The integrated circuit device is simulated based on the adjusted dimension.

21 Claims, 5 Drawing Sheets

COMPENSATING FOR LAYOUT DIMENSION EFFECTS IN SEMICONDUCTOR DEVICE MODELING

CROSS-REFERENCE TO RELATED APPLICATIONS

Not applicable.

STATEMENT REGARDING FEDERALLY SPONSORED RESEARCH OR DEVELOPMENT

Not applicable

BACKGROUND OF THE INVENTION

The present invention relates generally to semiconductor manufacturing and, more particularly, to compensating for layout dimension effects in semiconductor device modeling.

The manufacturing of semiconductor devices may involve many process steps. For example, semiconductor fabrication typically involves processes such as deposition processes, etching processes, thermal growth processes, various heat treatment processes, ion implantation, photolithography, etc. Such processes may be performed in any of a variety of different combinations to produce semiconductor devices that are useful in a wide variety of applications.

In general, there is a constant drive within the semiconductor industry to increase the operating speed and efficiency of various integrated circuit devices, e.g., microprocessors, memory devices, and the like. This drive is fueled by consumer demands for computers and electronic devices that operate at increasingly greater speeds and efficiency. This demand for increased speed and efficiency has resulted in a continual reduction in the size of semiconductor devices, e.g., transistors, as well as the packing density of such devices on an integrated circuit device. That is, many parameters of a typical field effect transistor (FET), e.g., channel length, junction depths, gate insulation thickness, and the like, are reduced. For example, all other things being equal, the smaller the channel length of the transistor or the thinner the gate insulation layer, the faster the transistor will operate. Thus, there is a constant drive to reduce the size, or scale, of the components of a typical transistor to increase the overall speed of the transistor, as well as integrated circuit devices incorporating such transistors.

Modern field effect transistors comprise a gate electrode, a gate insulation layer, a source region and a drain region. When an appropriate voltage is applied to the gate electrode, a channel region is formed between the source region and the drain region and electrons (or holes) flow between the source region and drain region. The source and drain regions of such transistors are normally the same. For example, for an NMOS transistor, both the source and drain regions are formed by introducing an N-type dopant material, e.g., arsenic, into the semiconductor material. For a PMOS transistor, the source and drain regions are formed by introducing a P-type dopant material, e.g., boron, into the semiconductor material.

Typically, during the design of a semiconductor device, various circuit elements, such as transistors, are simulated to predict their characteristics, such as threshold voltage, drain-to-source resistance, breakdown voltage, etc. FIGS. 1A and 1B illustrate devices 100 and 120, respectively, that may be simulated using a model. The device 100 is a three-finger transistor having three lines 102, 104, 106 extending from a base member 108. The lines 102, 104, 106 and base member 108 define a transistor gate electrode. The lines 102, 104, 106 intersect an active region 110. In defining the devices for modeling purposes, the width, $W_1$, of the active region and the length (i.e., commonly referred to as a channel length), $L_1$, $L_1$, $L_3$, of the lines 102, 104, 106 are defined.

The device 120 includes two lines 122, 124 each having a length, $L_4$, $L_5$, intersecting an L-shaped active region 126 having widths, $W_2$, $W_3$. Based on the specified parameters, a model may be used to predict the characteristics of the devices. Of course, many other parameters of the devices 100, 120 are specified in addition to the length and width dimensions, such as material of construction, doping profiles, etc.

The use of device models provides designers with information about the expected performance characteristics of the integrated circuit prior to its implementation in an actual semiconductor device. Using this information, design parameters may be changed and refined prior to any actual fabrication.

However, in actual fabricated devices, the devices are not fabricated as shown in the ideal geometries of FIGS. 1A and 1B. For instance, the corners of the devices 100, 120, such as corners 112 where the lines 102, 104, 106 intersect the base member 110 or the corner 128 of the L-shaped active region 126 are typically not perfectly square. Modeling the devices 100, 120 using ideal length and width parameters results in some degree of inaccuracy, because it does not account for the corner rounding. This variation between the simulated ideal devices and the actual fabricated devices induces variation between the predicted performance parameters and the actual performance parameters of the fabricated devices. As device geometries continually decrease, these small modeling inaccuracies have an increasingly noticeable effect on the performance of the completed devices.

This section of this document is intended to introduce various aspects of art that may be related to various aspects of the present invention described and/or claimed below. This section provides background information to facilitate a better understanding of the various aspects of the present invention. It should be understood that the statements in this section of this document are to be read in this light, and not as admissions of prior art. The present invention is directed to overcoming, or at least reducing the effects of, one or more of the problems set forth above.

BRIEF SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One aspect of the present invention is seen in a method for compensating for layout dimension effects. The method includes receiving design data associated with an integrated circuit device. The integrated circuit device includes a first element having a corner defined therein and a second element overlapping the first element. A dimension specified for the first element in the design data is adjusted based on a distance between the second element and the corner. The integrated circuit device is simulated based on the adjusted dimension.

Another aspect of the present invention is seen in a modeling system including a corner compensation unit and a device modeling unit. The corner compensation unit is operable to receive design data associated with an integrated circuit device. The integrated circuit device includes a first element having a corner defined therein and a second element overlapping the first element. The corner compensation unit is operable to adjust a dimension specified for the first element in the design data based on a distance between the second element and the corner. The device modeling unit is operable to simulate the integrated circuit device based on the adjusted dimension.

BRIEF DESCRIPTION OF THE SEVERAL VIEWS OF THE DRAWINGS

The invention will hereafter be described with reference to the accompanying drawings, wherein like reference numerals denote like elements, and.

Figure 1A:
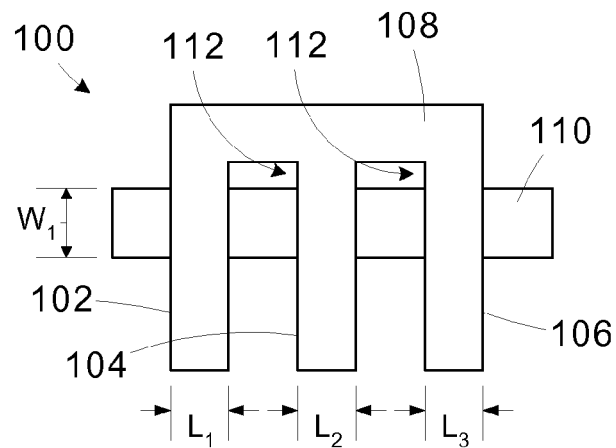
FIGS. 1A and 1B are diagrams of ideal integrated circuit devices used for specifying design parameters for device simulation and modeling.
Figure 1B:
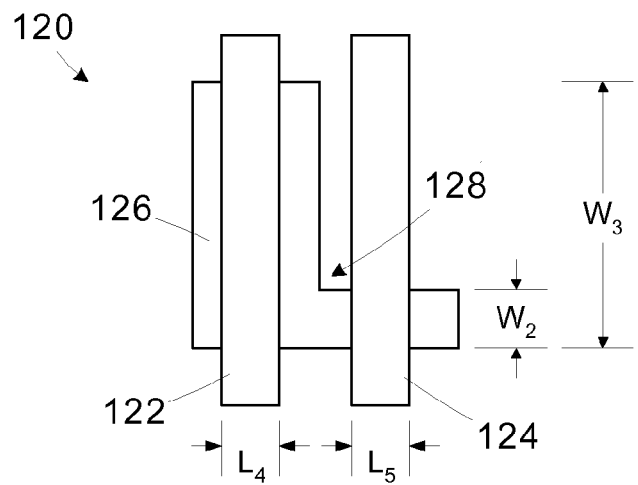

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

One or more specific embodiments of the present invention will be described below. It is specifically intended that the present invention not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the present invention unless explicitly indicated as being "critical" or "essential."

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Figure 2A:
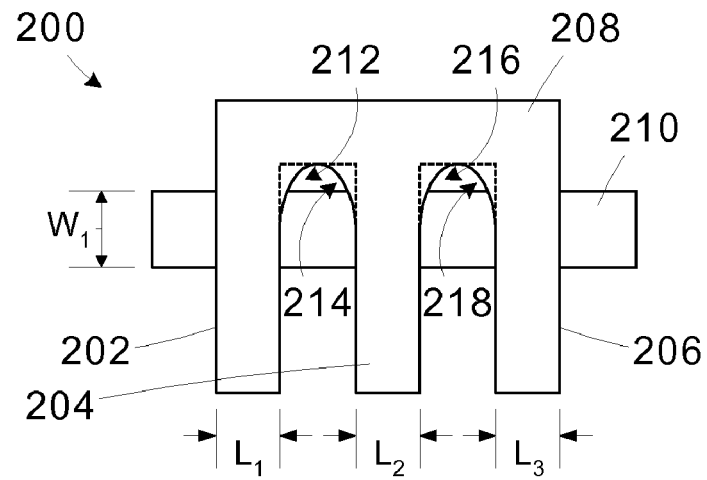
FIGS. 2A and 2B are diagrams of actual integrated circuit devices illustrating how ideal model parameters may be adjusted to account for corner effects in accordance with one illustrative embodiment of the present invention.
Figure 2B:
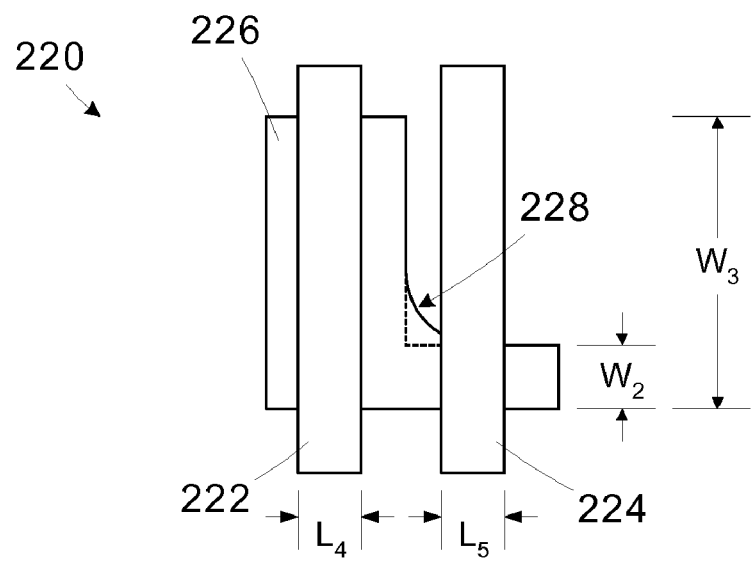

Referring now to the drawings wherein like reference numbers correspond to similar components throughout the several views and, specifically, referring to FIGS. 2A and 2B, the present invention shall be described in the context of diagrams of fabricated integrated circuit devices 200, 220. To allow comparison, the outlines of corresponding ideal integrated devices are shown in phantom.

The device 200 is a three-finger transistor having three lines 202, 204, 206 extending from a base member 208. The lines 202, 204, 206 and base member 208 define a transistor gate electrode. The lines 202, 204, 206 intersect an active region 210. Note that the corners 212, 214, 216, 218 are rounded as compared to the ideal device shown in phantom. This rounding results in an actual length (i.e., channel length) for the lines 202, 204, 206 that varies with the distance from the corners 212, 214, 216, 218. Also note that the line 204 exhibits increased length from both corners 214, 216, while the lines 202, 206 only exhibit increased length from one corner 212, 218, respectively.

With respect to the device 220, two lines 222, 224 intersect an L-shaped active region 226. Note that the active region 226 exhibits a rounded corner 228 as compared to the ideal device shown in phantom. This rounding results in an actual width for the active region 226 intersecting the line 224 that varies with the distance from the corner 228. Also note that the intersection between the line 222 and the active region 226 does not exhibit and width variation, as the line 222 does not overlap the corner 228.

Figure 3:
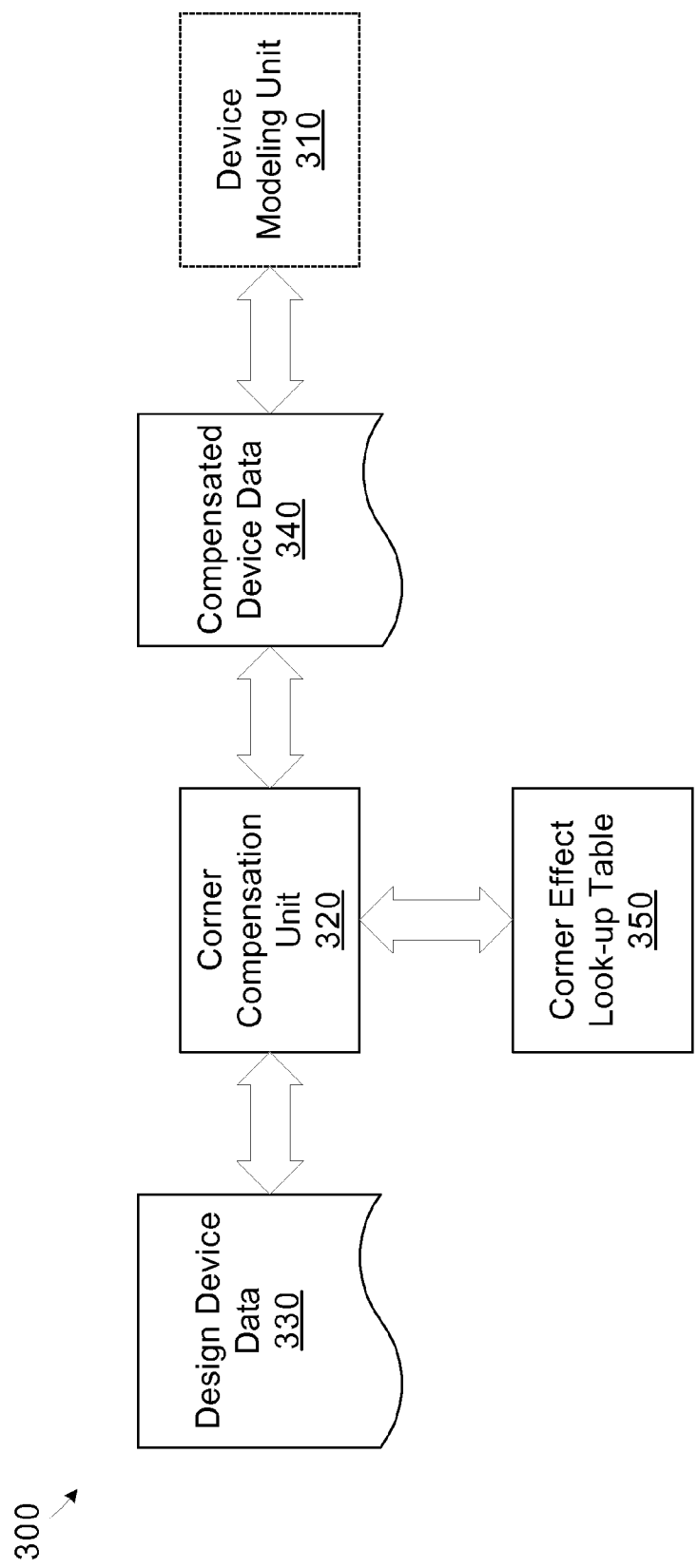
FIG. 3 is a simplified block diagram of a modeling system in accordance with another illustrative embodiment of the present invention.

Turning now to FIG. 3, a simplified block diagram of a modeling system 300 in accordance with another illustrative embodiment of the present invention is provided. The modeling system 300 may be implemented using one or more general purpose or specialized computing devices, such as a microprocessor based workstation. The modeling system 300 includes a device modeling unit 310 that predicts the performance characteristics of an integrated circuit device (e.g., one of the devices 200, 220 of FIGS. 2A and 2B or an entire layout of devices). A corner compensation unit 320 receives design device data 330 (i.e., ideal data) and adjusts the design device data 330 based on the corner effects to generate the compensated device data 340. The compensated device data 340 is provided to the device modeling unit 310 for analysis. An exemplary software tool capable of performing the functions of the device modeling unit 310 is the PSPICE tool offered commercially by Fairchild Semiconductor International of South Portland, Me. As the particular functions performed by the device modeling unit 310 are known to those of ordinary skill in the art, they are not described in detail herein for clarity and to avoid obscuring the present invention.

There are various techniques by which the corner compensation unit 320 may adjust the design device data 330 to compensate for corner effects. In one embodiment, the corner compensation unit 320 calculates an average dimension for the device parameter (e.g., active region width) affected by a corner. The average considers the total dimension variation caused by the corner. For example, as shown in FIG. 4B, for the device 220, the corner compensation unit 320 assigns a compensated width, $W_2'$, to account for the overlap between the active region 126 and the corner 128.

Figure 4A:
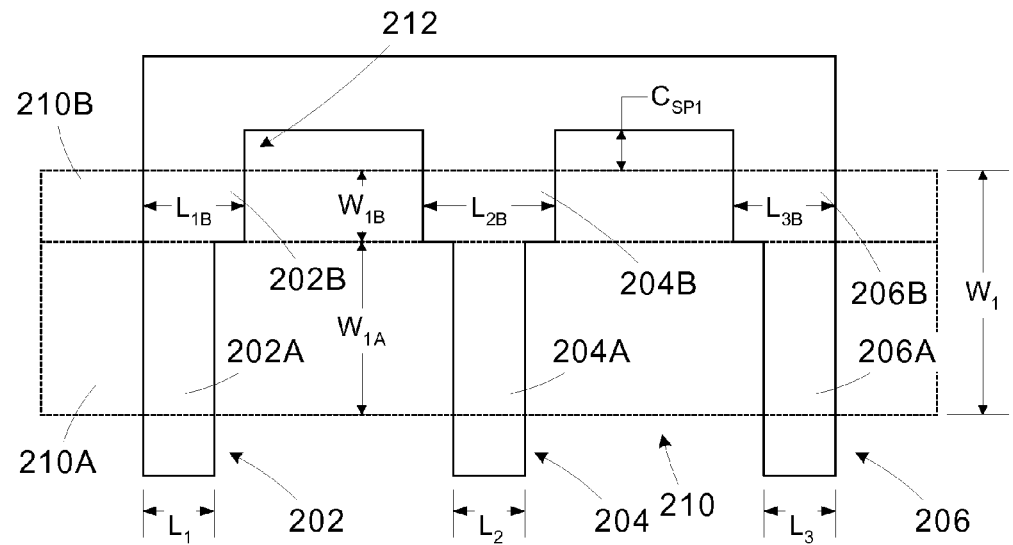
FIGS. 4A and 4B are diagrams of modeled integrated circuit devices adjusted to compensate for corner effects in accordance with another illustrative embodiment of the present invention.
Figure 4B:
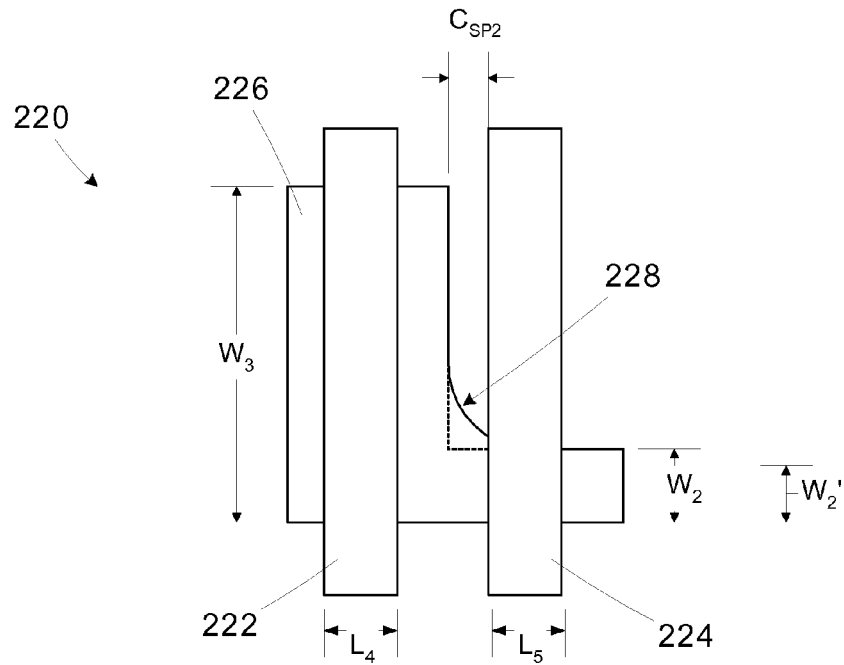

In another embodiment illustrated in FIG. 4A, the corner compensation unit 320 may represent the device 200 as a group of parallel devices, each having lengths or widths compensated for corner effects. The corner compensation unit 320 represents the line 202 as two lines 202A, 202B. The line 202A has a length of $L_1$ and the line 202B has a length of $L_{1B}$. The length of line 202A is not affected by the corner, while the length of line 202B is compensated for the corner by providing an increased length. The active region 210 is also divided into separate portions 210A, 210B having widths $W_{1A}$ and $W_{1B}$ corresponding to the divisions in the line 202. The device modeling unit 310 then models the line 202 as two parallel devices, one (202A) having a length of $L_1$ and $W_{1A}$ and the other (202B) having a length of $L_{1B}$ and $W_{1B}$. Similar portions may be defined for the remaining lines 204, 206. Note that the length, $L_{2B}$, of line portion 204B is compensated for both corners. The number of sub-lines 202A, 202B into which each line 202, 204, 206 is divided depends on the particular embodiment. For example, the corner compensation unit 320 may subdivide each line 202, 204, 206 into three or more segments, each having lengths compensated for the corner rounding effects.

Returning now to FIG. 3, in some embodiments, the corner compensation unit 320 employs a corner effect look-up table 350 that specifies a variation amount based on the distance from the corner. For example, to determine the corner effects for the line 202, the corner compensation unit 320 determines the length variation that defines the intersection between the line 202 and the active region 210 along the corner 212 and generates compensated lengths. The corner effect look-up table 350 may specify the amount of the length compensation (e.g., $L_{1B}$) and the width of the compensated portion of the active region 210 (e.g., $W_{1B}$) as a function of the corner spacing, $C_{SP1}$. The look-up table 350 may specify the length at various distances offset from the corner. With respect to the device 220, the look-up table 350 may specify the width, $W_2'$, as a function of the corner spacing, $C_{SP2}$.

As an alternative to the corner effect look-up table 350, the corner compensation unit 320 may employ an equation that specifies the dimension variation as a function of the distance from the corner. The equation may be used to determine the length or width at different points displaced from the corner.

The corner effect look-up table 350 or equation may be derived based on measurements taken from a plurality fabricated devices of the type being modeled. Different look-up tables and/or equations may be developed for different types of devices. Exemplary techniques for quantifying the corner effects are described in U.S. patent application Ser. No. 11/425,913, entitled "METHODS OF QUANTIFYING VARIATIONS RESULTING FROM MANUFACTURING-INDUCED CORNER ROUNDING OF VARIOUS FEATURES, AND STRUCTURES FOR TESTING SAME," filed on Jun. 22, 2006, assigned to the assignee of the present application, and incorporated herein by reference in its entirety.

The corner compensation unit 320 may average the dimension variation across the corner to generate the compensated length, $L_{1B}$, or width, $W_2'$. Another way to express the averaging is that the corner compensation unit 320 determines the area of overlap between the element (e.g., line or active region) and the corner and adjusts the length or width so that the total area matches the design area plus the area of the corner overlap. To approximate the area of overlap, the corner compensation unit 320 may determine the dimension variation at different points along the corner and integrate along those points. The compensated length or width dimension may be increased based on the determined area. The number of points over which the variation may be averaged may vary depending on the particular implementation. For example, with respect to the device 200, the compensated length, $L_{1B}$, may be increased such that $L_{1B}$ times $W_{1B}$ equals $L_1$ times $W_{1B}$ plus the area of overlap. Similarly, with respect to the device 220, the compensated width, $W_2'$ may be set such that $W_2'$ times $L_5$ equals $W_2$ times $L_5$ plus the area of overlap.

Figure 5:
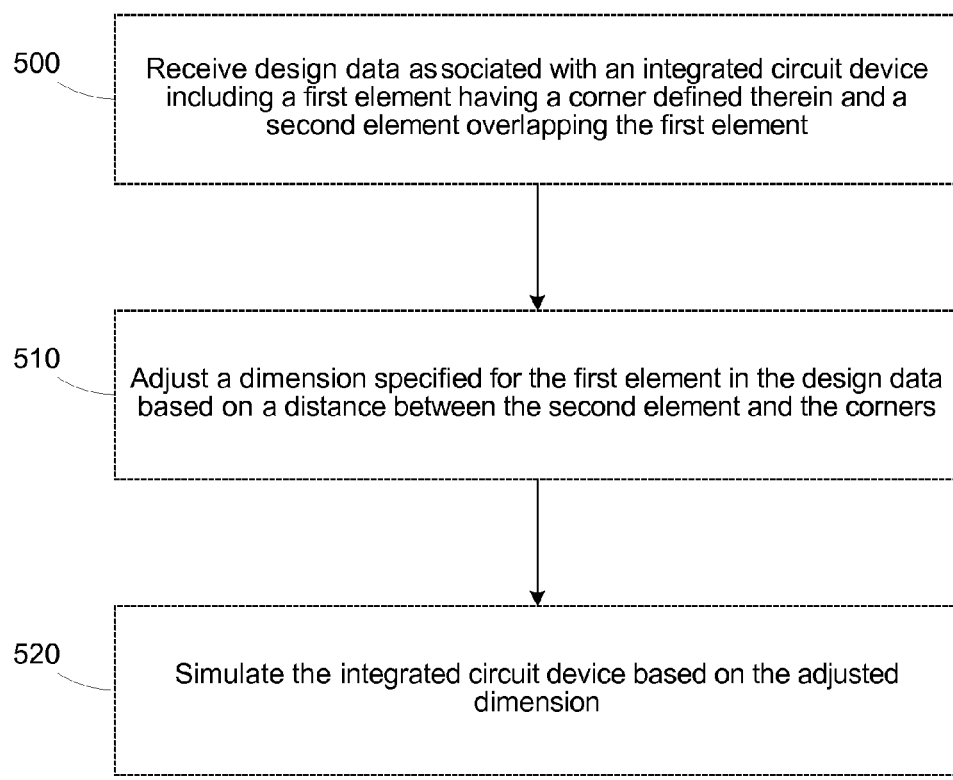
FIG. 5 is a simplified flow diagram of a method for compensating for layout dimension effects accordance with another illustrative embodiment of the present invention.

Turning now to FIG. 5, a simplified flow diagram of a method for compensating for layout dimension effects in accordance with another illustrative embodiment of the present invention is provided. In block 500, design data associated with an integrated circuit device including a first element having a corner defined therein and a second element overlapping the first element is received. In block 510, a dimension specified for the first element in the design data is adjusted based on a distance between the second element and the corner. In block 520, the integrated circuit device is simulated based on the adjusted dimension.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

We claim:

1. A method, comprising:
   receiving design data associated with a layout of an integrated circuit device including a first element having a corner defined therein and a second element overlapping the first element, wherein the first and second elements define at least a portion of a transistor;
   adjusting a dimension specified for the first element in the design data based on a distance between the second element and the corner using a modeling system including at least one computing device; and
   simulating at least one electrical performance parameter of the transistor based on the adjusted dimension in the design data using the modeling system.

2. The method of claim 1, wherein the corner comprises a first corner, and the first element further includes a second corner defined therein, and adjusting the dimension further comprises further adjusting the dimension based on the distance between the second element and the second corner.

3. The method of claim 1, wherein adjusting the dimension comprises determining an area of overlap between the second element and at least a portion of the corner and adjusting the dimension based on the area of overlap.

4. The method of claim 1, further comprising:
   modeling overlap between the second element and the corner as a function of the distance between the second element and the corner; and
   adjusting the dimension based on the modeled overlap.

5. The method of claim 4, further comprising modeling the overlap using an equation.

6. The method of claim 4, further comprising modeling the overlap using a look-up table.

7. The method of claim 4, wherein modeling the overlap further comprises modeling a dimension variation as a function of the distance from the second element to the corner.

8. The method of claim 7, wherein adjusting the dimension comprises:
   determining the dimension variation at a plurality of points on the second element; and
   determining an area of overlap between the second element and at least a portion of the corner based on the dimension variation at the plurality of points.

9. The method of claim 7, wherein adjusting the dimension comprises:
   determining the dimension variation at a plurality of points on the second element; and
   averaging the dimension variation to adjust the dimension.

10. The method of claim 1, wherein adjusting the dimension further comprises:
    dividing the first element into sub-elements; and
    adjusting a dimension of at least one sub-element based on the distance between the second element and the corner.

11. The method of claim 1, wherein the first element comprises a gate electrode of the transistor, the second element comprises an active region of the transistor, and the dimension comprises a length of at least a portion of the gate electrode.

12. The method of claim 11, wherein adjusting the dimension further comprises:
    dividing the gate electrode into a plurality of gate electrode portions; and
    adjusting a length of at least one gate electrode portions based on the distance between the active region and the corner.

13. The method of claim 12, further comprising:
    dividing the active region into a plurality of active region portions, each active region portion being associated with at least one of the gate electrode portions; and
    simulating the integrated circuit device as a plurality of parallel integrated circuit device components, each of the integrated circuit device components being defined by one of the gate electrode portions and an associated active region portion.

14. The method of claim 11, further comprising:
    determining an amount of overlap between the active region and the corner defined in the gate electrode; and
    adjusting the length of at least a portion of the gate electrode to compensate for the amount of overlap.

15. The method of claim 1, wherein the first element comprises an active region of the transistor, the second element comprises a gate electrode of the transistor, and the dimension comprises a width of at least a portion of the active region.

16. The method of claim 15, further comprising:
    determining an amount of overlap between the gate electrode and the corner defined in the active region; and
    adjusting the width of at least a portion of the active region to compensate for the amount of overlap.

17. A modeling system, comprising:
    a corner compensation unit implemented by a first computing device and operable to receive design data associated with a layout of an integrated circuit device including a first element having a corner defined therein and a second element overlapping the first element and adjust a dimension specified for the first element in the design data based on a distance between the second element and the corner, wherein the first and second elements define at least a portion of a transistor; and
    a device modeling unit implemented by a second computing device and operable to simulate at least one electrical performance parameter of the transistor based on the adjusted dimension in the design data.

18. The system of claim 17, wherein the corner compensation unit is operable to determine an amount of overlap between the second element and at least a portion of the corner and adjust the dimension based on the amount of overlap.

19. The system of claim 17, wherein the transistor has a gate electrode and an active region, the first element comprises one of the gate electrode and the active region, and the second element comprises the other of the gate electrode and the active region.

20. The system of claim 17, wherein the corner compensation unit is operable to divide the first element into sub-elements and adjust a dimension of at least one sub-element based on the distance between the second element and the corner.

21. A system, comprising:
    means for receiving design data associated with a layout of an integrated circuit device including a first element having a corner defined therein and a second element overlapping the first element, wherein the first and second elements define at least a portion of a transistor;
    means for adjusting a dimension specified for the first element in the design data based on a distance between the second element and the corner; and
    means for simulating at least one electrical performance parameter of the transistor based on the adjusted dimension in the design data.

* * * * *